United States Patent
Sun et al.

(10) Patent No.: US 10,182,504 B1
(45) Date of Patent: Jan. 15, 2019

(54) ROUNDED LATCHING STRUCTURE

(71) Applicants: Fu Tai Hua Industry (Shenzhen) Co., Ltd., Shenzhen (CN); HON HAI PRECISION INDUSTRY CO., LTD., New Taipei (CN)

(72) Inventors: Yu-Chun Sun, New Taipei (TW); Zhan-Sheng Lu, Shenzhen (CN); Ze-Min Wu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/870,859

(22) Filed: Jan. 13, 2018

(30) Foreign Application Priority Data

Jan. 9, 2018 (CN) .................... 2018 2 0036882 U

(51) Int. Cl.
| | |
|---|---|
| *H05K 5/00* | (2006.01) |
| *G06F 1/18* | (2006.01) |
| *H05K 5/02* | (2006.01) |
| *F16B 21/07* | (2006.01) |
| *H05K 5/03* | (2006.01) |

(52) U.S. Cl.
CPC ......... *H05K 5/0221* (2013.01); *F16B 21/075* (2013.01); *G06F 1/181* (2013.01); *H05K 5/0004* (2013.01); *H05K 5/0239* (2013.01); *H05K 5/03* (2013.01)

(58) Field of Classification Search
CPC .................................. G06F 1/181; H05K 5/03
USPC ....................................................... 361/679.6
See application file for complete search history.

(56) References Cited

U.S. PATENT DOCUMENTS

| | | | | |
|---|---|---|---|---|
| D333,784 S | * | 3/1993 | Goodman | D3/302 |
| 5,909,357 A | * | 6/1999 | Orr | G06F 1/16 |
| | | | | 361/679.46 |
| D413,598 S | * | 9/1999 | Cheung | D14/501 |
| D426,858 S | * | 6/2000 | Straus | D21/329 |
| 6,366,455 B1 | * | 4/2002 | Diaz | G06F 1/181 |
| | | | | 292/307 R |
| 6,848,802 B2 | * | 2/2005 | Chen | G06F 1/1601 |
| | | | | 362/191 |
| D561,242 S | * | 2/2008 | Dahl | D18/4.6 |
| 7,443,691 B1 | * | 10/2008 | Davis | H05K 5/0278 |
| | | | | 361/752 |
| D586,347 S | * | 2/2009 | Cheng | D14/433 |
| 7,495,899 B2 | * | 2/2009 | Liu | H01M 2/1066 |
| | | | | 361/679.28 |
| D592,217 S | * | 5/2009 | Chen | D14/480.2 |
| 8,611,079 B2 | * | 12/2013 | Zhang | H05K 5/0278 |
| | | | | 361/679.31 |

(Continued)

*Primary Examiner* — Adrian S Wilson
(74) *Attorney, Agent, or Firm* — ScienBiziP, P.C.

(57) ABSTRACT

A rounded latching structure includes a main body, a back cover, and a lock. The main body defines a groove bound by a bottom wall and a sidewall. The bottom wall defines a slot. The side wall includes a first snap. The back cover defines a second slot and includes a second snap. The back cover is slidable relative to the main body along the groove defined in the main body. The first snap is snapped in the second slot. The second snap is snapped in the first slot. The lock includes a resisting portion for fixing the back cover to the main body when the back cover is snapped to the main body.

10 Claims, 7 Drawing Sheets

(56) References Cited

U.S. PATENT DOCUMENTS

| | | | |
|---|---|---|---|
| 2002/0097561 A1* | 7/2002 | Carr | G06F 1/181 |
| | | | 361/725 |
| 2003/0026072 A1* | 2/2003 | Hrehor, Jr. | E05D 3/06 |
| | | | 361/679.6 |
| 2006/0027697 A1* | 2/2006 | Gojanovic | B65H 75/4434 |
| | | | 242/388.1 |
| 2008/0132289 A1* | 6/2008 | Wood | H04B 1/3888 |
| | | | 455/566 |
| 2011/0182014 A1* | 7/2011 | Zhang | H01R 13/60 |
| | | | 361/679.4 |
| 2014/0362519 A1* | 12/2014 | Degner | G06F 1/20 |
| | | | 361/679.46 |

\* cited by examiner

ROUNDED LATCHING STRUCTURE

CROSS-REFERENCE TO RELATED APPLICATIONS

This application claims priority to Chinese Patent Application No. 201820036882.0 filed on Jan. 9, 2018, the contents of which are incorporated by reference herein.

FIELD

The subject matter herein generally relates to latching structures, and more particularly to a latching structure for a rounded device.

BACKGROUND

Generally, casings of electronic devices must be assembled by a latching structure. When portions of the casing are rounded, a difficulty of assembling the casing increases.

BRIEF DESCRIPTION OF THE DRAWINGS

Implementations of the present disclosure will now be described, by way of example only, with reference to the attached figures.

DETAILED DESCRIPTION

Figure 1:
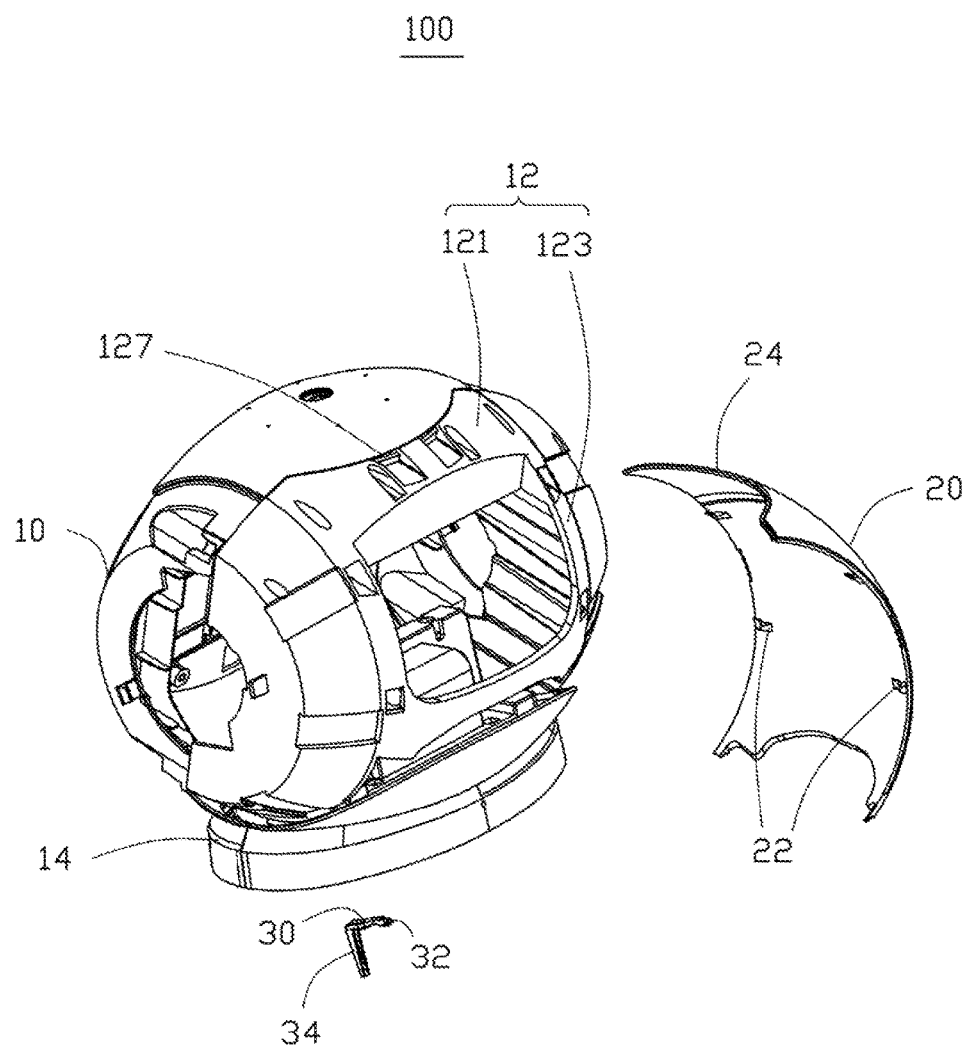
FIG. 1 is an exploded, isometric view of an exemplary embodiment of a rounded latching structure in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an embodiment of a rounded latching structure 100. The rounded latching structure 100 includes a main body 10, a back cover 20, and a lock 30. The main body 10 defines a groove 12. The groove 12 is bound by a bottom wall 121 and a sidewall 123. The bottom wall 121 defines at least one first slot 125, and the sidewall 123 includes at least one first snap 127. The back cover 20 includes at least one second snap 22 and defines at least one second slot 24. The back cover 20 is slidable relative to the main body 10 along the groove 12. The first snap 127 is snapped in the second slot 24, and the second snap 22 is snapped in the first slot 125. The lock 30 includes a resisting portion 32 for fixing the back cover 20 to the main body 10 when the back cover 20 is snapped to the main body 10.

Figure 2:
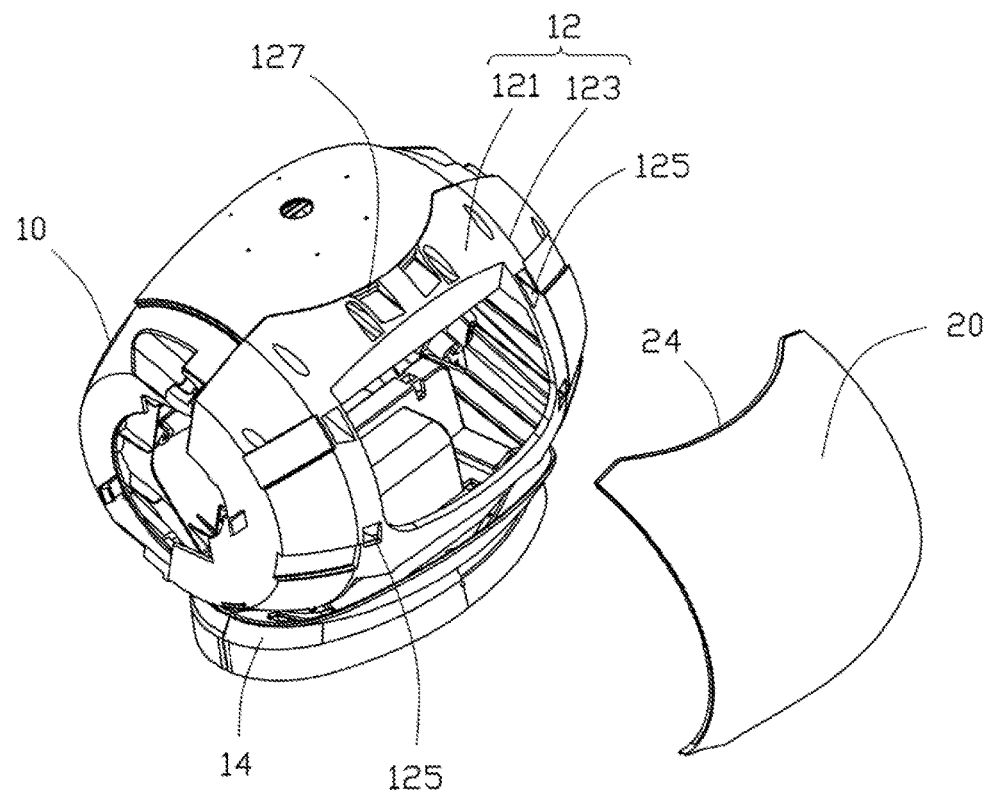
FIG. 2 is another exploded, isometric view of the rounded latching structure in FIG. 1.

Referring to FIG. 2, the groove 12 is defined in an outer surface of the main body 10. The bottom wall 121 and the back cover 20 are rounded. A curvature of the back cover 20 and the bottom wall 121 are substantially the same. A quantity of the first slot 125 is the same as a quantity of the second snap 22, and the first slot 125 corresponds in position to the second snap 22. Thus, the second snap 22 is snapped in the first slot 125 (shown in FIG. 3).

Figure 3:
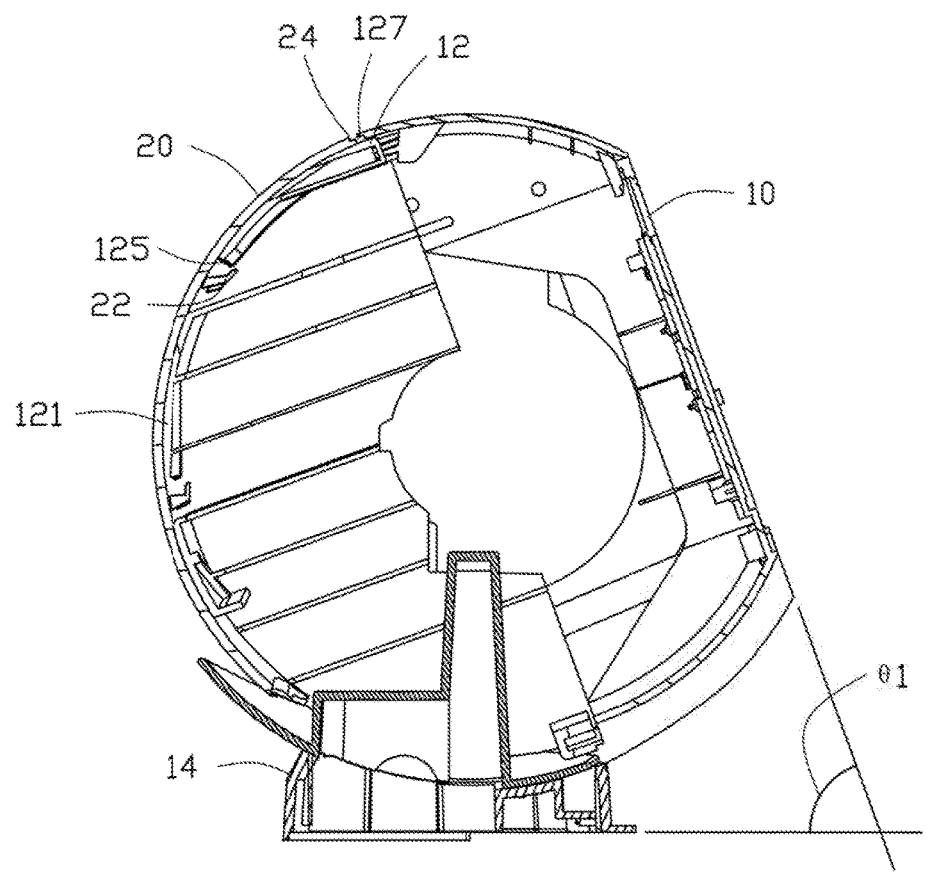
FIG. 3 is a side view of the rounded latching structure

Referring to FIG. 3, the bottom wall 121 of the groove 12 is surrounded by the sidewall 123. The first snap 127 is arranged at an upper portion of the sidewall 123 and an upper portion of the groove 12. Correspondingly, the second slot 24 is defined in an upper part of the back cover 20. Thus, the back cover 20 is snapped to the bottom wall 121 by the second snap 22 snapping in the first slot 127.

In assembling the back cover 20 to the main body 10, the back cover 20 is positioned corresponding to the bottom wall 121 such that the second snap 24 is aligned with the first slot 125. When the back cover 20 is snapped to the bottom wall 121 by the second snap 24 snapping in the first slot 125, the base 14 and the main body 10 define a first fitting angle.

Figure 4:
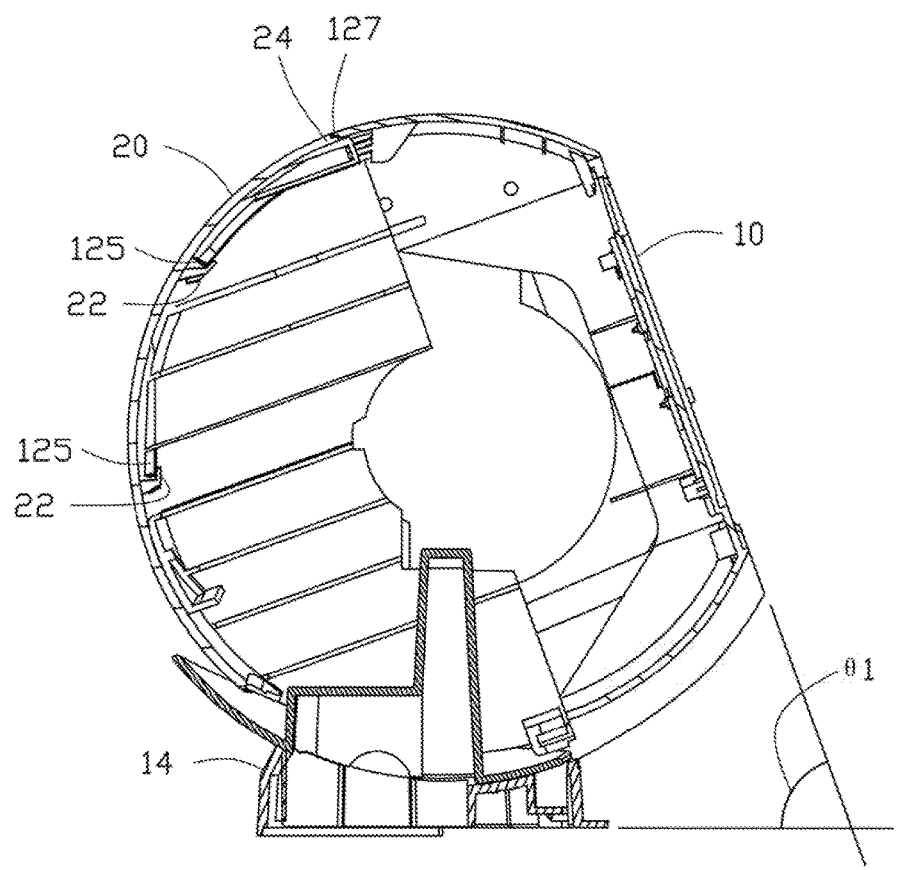
FIG. 4 is another side view of the rounded latching structure.

Referring to FIG. 4, after the second snap 22 is snapped in the first slot 127, the back cover 20 is slid upward along the groove 12 to snap the first snap 127 in the second slot 24 and tighten the second snap 22 in the first slot 127, thereby snapping the back cover 20 to the bottom wall 121. The base 14 supports the main body 10, and the main body 10 is rotatable relative to the base 14.

Figure 5:
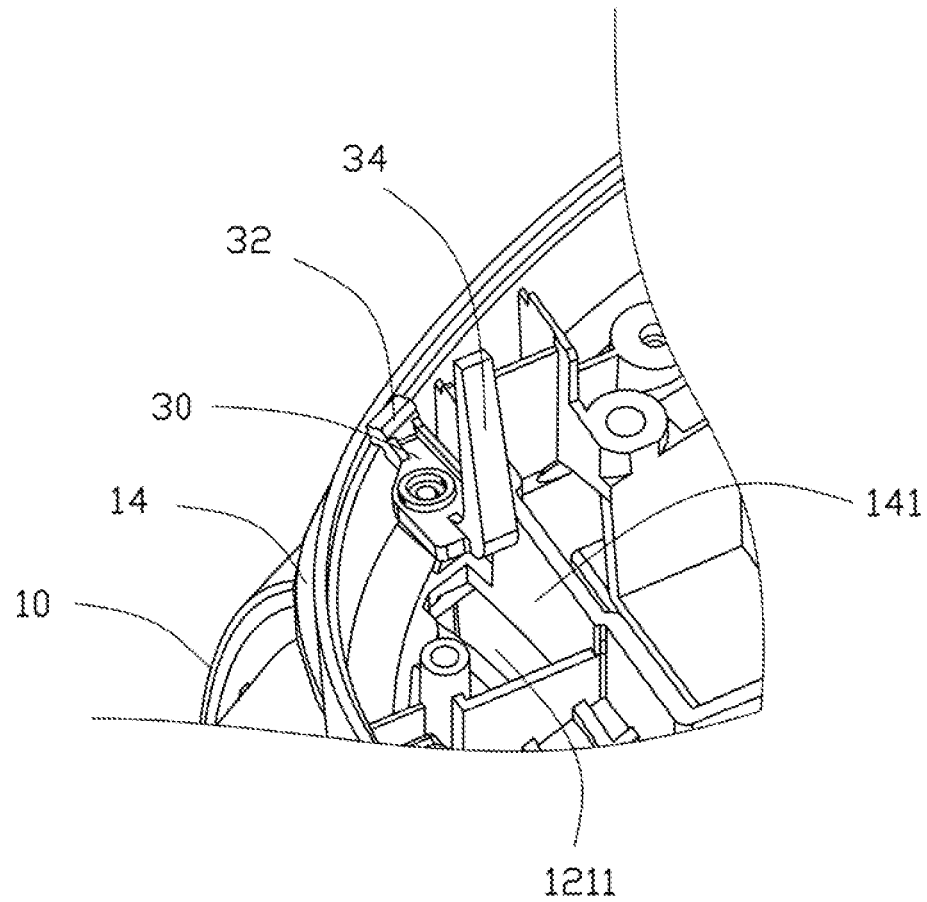
FIG. 5 is an isometric view of a lock shown in FIG. 1.
Figure 6:
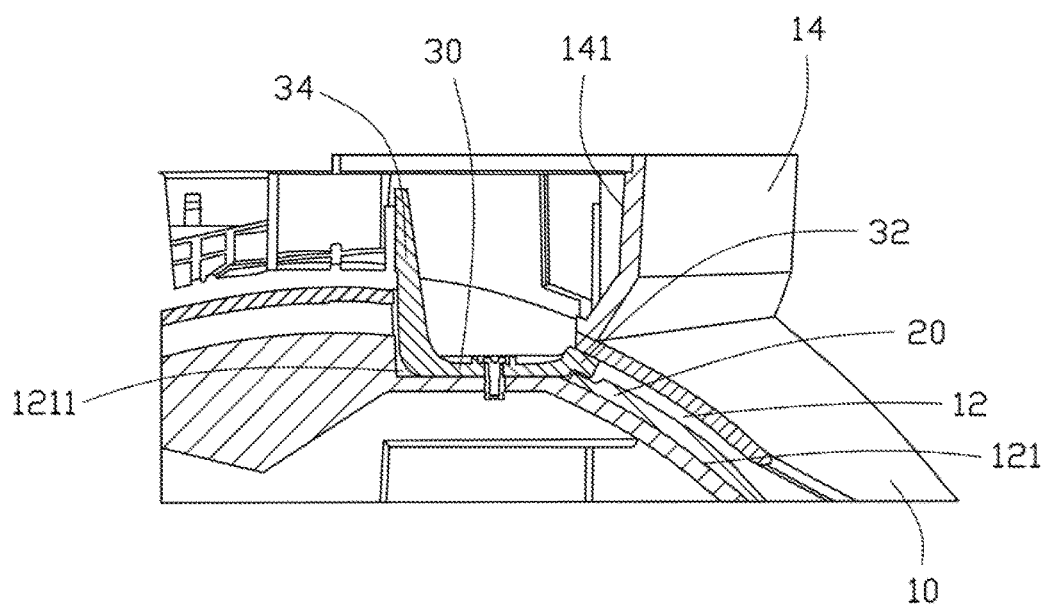
FIG. 6 is a side view of the lock locking the rounded latching structure.

Referring to FIG. 5, a through hole 141 is defined through the base 14 and the main body 10. The through hole 141 communicates with the groove 12. The bottom wall 121 comprises an adjoining surface 1211 between the groove 12 and the through hole 141. When the main body 10 is rotated, the lock 30 can pass through the through hole 141 to be locked on the adjoining surface 1211. The resisting portion 32 of the lock 30 resists against the back cover 20 within the groove 12 (shown in FIG. 6) to maintain a tight fit between the back cover 20 and the bottom wall 121.

Figure 7:
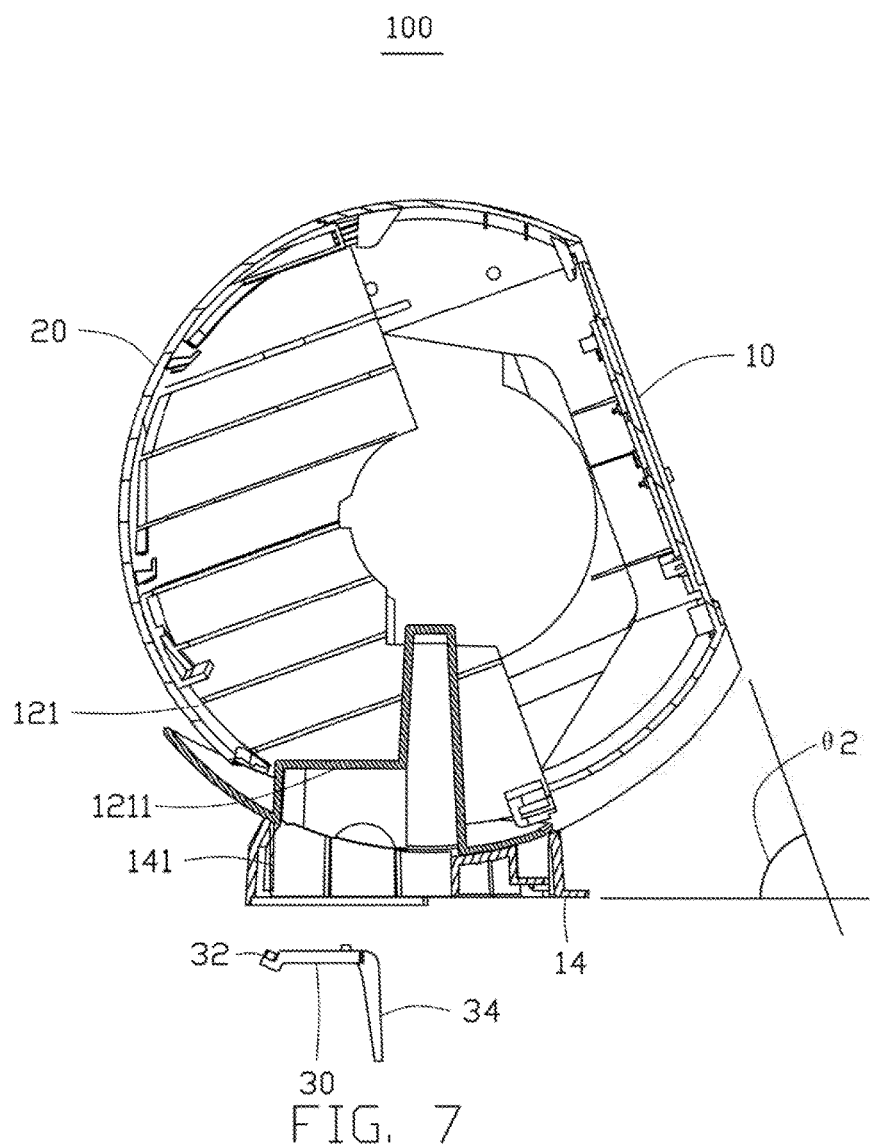
FIG. 7 is another side view of the rounded latching structure.

The lock 30 further includes a handheld portion 34 extended perpendicularly at an end opposite from the resisting portion 32. The handheld portion 34 facilitates locking the lock 30 to the adjoining surface 1211. When the adjoining surface 1211 is aligned with the through hole 141, the lock 30 can be handled by the handling portion 34 to lock the lock 30 to the adjoining surface 1211. When the lock 30 is locked to the adjoining surface 1211, the base 14 and the main body 10 define a second fitting angle (shown in FIG. 7). In at least one embodiment, the second fitting angle is smaller than the first fitting angle. The first fitting angle is about 75 degrees, and the second fitting angle is about 61 degrees.

When the base 14 and the main body 10 define the first fitting angle, the second snap 22 is easily snapped in the first slot 125 to snap the back cover 20 to the bottom wall 121. After the back cover 20 is slid upward along the groove 12, the back cover 20 is completely snapped to the bottom wall 121. Then, the main body 10 is turned upside down and rotated to cause the base 14 and the main body 10 to define the second fitting angle in order to easily lock the lock 30 to the adjoining surface 1211. Thus, assembly and disassembly of the back cover 20 to the main body 10 is defined by specified angles, positions, and directions.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A rounded latching structure comprising:
   a main body defining a groove bound by a bottom wall and a sidewall, wherein the bottom wall defines a first slot, the side wall comprises a first snap;
   a back cover defining a second slot and comprising a second snap, wherein the back cover is slidable relative to the main body along the groove defined in the main body, the first snap is snapped in the second slot, the second snap is snapped in the first slot; and
   a lock comprising a resisting portion, wherein the resisting portion fixes the back cover to the main body when the back cover is snapped to the main body.

2. The rounded latching structure of claim 1, wherein the main body comprises a base for supporting the main body thereon; a through hole is defined through the base and the main body to communicate with the groove.

3. The rounded latching structure of claim 2, wherein the bottom wall comprises an adjoining surface between the through hole and the groove; the lock is passed through the through hole to be arranged on the adjoining surface, thereby causing the resisting portion to resist against the back cover within the groove.

4. The rounded latching structure of claim 3, wherein the lock comprises a handheld portion perpendicularly extending from an end of the lock opposite from the resisting portion; the handheld portion is handled for assembling the lock to the adjoining surface.

5. The rounded latching structure of claim 2, wherein the bottom wall of the groove and the back cover are each rounded; a quantity of the first slot is equal to a quantity of the second snap; the first slot corresponds in position to the second snap; the second snap and the first slot snap together the back cover and the bottom wall.

6. The rounded latching structure of claim 5, wherein the first snap is arranged at an upper portion of the sidewall; the second slot is defined in an upper portion of the back cover; after the back cover is snapped to the bottom wall; the back cover is caused to slide upward along the groove to align the second slot to the first snap and to tighten the second snap in the first slot.

7. The rounded latching structure of claim 5, wherein when the second snap is snapped in the first slot, a first fitting angle is defined between the base and the main body, and the bottom wall is angled relative to the back cover.

8. The rounded latching structure of claim 3, wherein when the main body is rotated to cause the adjoining surface to be parallel to align with the through hole, a second fitting angle is defined between the base and the main body.

9. The rounded latching structure of claim 8, wherein in the second angle, the lock is passed through the through hole and locked to the adjoining surface, and the second angle is smaller than the first angle.

10. A robotic rounded latching structure comprising:
    a robotic main body defining a groove bound by a bottom wall and a sidewall, wherein the bottom wall defines a first slot, the side wall comprises a first snap;
    a back cover defining a second slot and comprising a second snap, wherein the back cover is slidable relative to the robotic main body along the groove defined in the robotic main body, the first snap is snapped in the second slot, the second snap is snapped in the first slot; and
    a lock comprising a resisting portion, wherein the resisting portion fixes the back cover to the robotic main body when the back cover is snapped to the robotic main body.

* * * * *